(12) United States Patent
Chow et al.

(10) Patent No.: US 9,431,390 B2
(45) Date of Patent: Aug. 30, 2016

(54) COMPACT ELECTROSTATIC DISCHARGE (ESD) PROTECTION STRUCTURE

(71) Applicant: Microchip Technology Incorporated, Chandler, AZ (US)

(72) Inventors: Pei-Ming Daniel Chow, Los Angeles, CA (US); Yon-Lin Kok, Cerritos, CA (US); Jing Zhu, Santa Monica, CA (US); Steven Schell, Torrance, CA (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 41 days.

(21) Appl. No.: 14/267,185

(22) Filed: May 1, 2014

(65) Prior Publication Data
US 2014/0327048 A1    Nov. 6, 2014

Related U.S. Application Data

(60) Provisional application No. 61/819,252, filed on May 3, 2013.

(51) Int. Cl.
*H01L 29/66* (2006.01)
*H01L 21/338* (2006.01)
*H01L 27/02* (2006.01)
(Continued)

(52) U.S. Cl.
CPC ....... *H01L 27/0292* (2013.01); *H01L 27/0207* (2013.01); *H01L 27/0248* (2013.01); *H01L 27/0605* (2013.01); *H01L 29/778* (2013.01); *H01L 27/0629* (2013.01)

(58) Field of Classification Search
CPC ......................... H01L 27/0292; H01L 29/778
USPC ............ 438/167, 172; 257/194, 24, E21.407
See application file for complete search history.

(56) References Cited

U.S. PATENT DOCUMENTS

| 7,593,204 B1 | 9/2009 | Iversen et al. .................. 361/56 |
| 7,881,029 B1 | 2/2011 | Li et al. .......................... 361/56 |
| 8,970,998 B2 * | 3/2015 | Takatani ............. H01L 29/2003 361/56 |

(Continued)

FOREIGN PATENT DOCUMENTS

TW    200812059 A    3/2008    ............. H01L 27/04

OTHER PUBLICATIONS

Cui, Qiang et al., "A Novel Electrostatic Discharge (ESD) Protection Circuit in D-Mode pHEMT Technology," IEEE Compound Semiconductor Integrated Circuit Symposium, Piscataway, NJ, 4 pages, Oct. 14, 2012.

(Continued)

*Primary Examiner* — Calvin Lee
(74) *Attorney, Agent, or Firm* — Slayden Grubert Beard PLLC (57) ABSTRACT

A multi-gate Schottky depletion-mode field effect transistor (FET), at least one diode and two resistors comprise a compact electrostatic discharge (ESD) protection structure. This ESD protection structure can be laid out in a smaller area than typical multiple diode ESD devices. The multi-gate FET may comprise various types of high-electron-mobility transistor (HEMT) devices, e.g., (pseudomorphic) pHEMT, (metamorphic) mHEMT, induced HEMT. The multiple gates of the Schottky field effect device are used to form an ESD trigger and charge draining paths for protection of circuits following the ESD protection device. Both single and dual polarity ESD protection devices may be provided on an integrated circuit die for protection of input-output circuits thereof.

21 Claims, 7 Drawing Sheets

(51) Int. Cl.
*H01L 29/778* (2006.01)
*H01L 27/06* (2006.01)

(56) References Cited

U.S. PATENT DOCUMENTS 9,064,704 B2 * 6/2015 Takatani ............ H01L 27/0266
361/56

2005/0189560 A1 9/2005 Park .............................. 257/192
2012/0256233 A1 10/2012 Cui et al. ..................... 257/195
2012/0262828 A1 10/2012 Muthukrishnan et al. ..... 361/56

OTHER PUBLICATIONS

International Search Report and Written Opinion, Application No. PCT/US2014/036499, 10 pages, Sep. 3, 2014.

* cited by examiner

FIGURE 2 (Prior Technology)

FIGURE 4 (Prior Technology)

COMPACT ELECTROSTATIC DISCHARGE (ESD) PROTECTION STRUCTURE

RELATED PATENT APPLICATION

This application claims priority to commonly owned U.S. Provisional Patent Application Ser. No. 61/819,252; filed May 3, 2013; entitled "Compact ESD Protection Structure," by Pei-Ming Daniel Chow, Yon-Lin Kok, Jing Zhu and Steven Schell; and is hereby incorporated by reference herein for all purposes.

TECHNICAL FIELD

The present disclosure relates to a semiconductor protection structures, in particular electrostatic discharge (ESD) protection structures.

BACKGROUND

A Schottky gate depletion-mode field effect device is sensitive to ESD damage due to its delicate metallic gate structure (0.5 µm or smaller metal gate length). Unlike CMOS silicon or bipolar transistor processes, there is no robust P-N junction diode available in a high-electron-mobility transistor (HEMT) process to form a compact ESD protection diode. A HEMT, also known as heterostructure FET (HFET) or modulation-doped FET (MODFET), is a field-effect transistor incorporating a junction between two materials with different band gaps (i.e., a heterojunction) as the channel instead of a doped region (as is generally the case for MOSFET). There are several versions of the HEMT, e.g., pseudomorphic HEMT (pHEMT), metamorphic HEMT (mHEMT), induced HEMT, etc. Several large Schottky diodes formed with the gate of the pHEMT device have to be cascaded in series to adequately protect the active HEMT circuits. These multiple Schottky diodes consume a large area in an expensive GaAs integrated circuit die.

A Schottky diode, also known as a hot carrier diode, is a semiconductor diode which has a low forward voltage drop and a very fast switching action. There is a small voltage drop across the diode terminals when current flows through a diode. A normal diode will have a voltage drop between 0.6 to 1.7 volts, while a Schottky diode voltage drop is usually between 0.15 and 0.45 volts. This lower voltage drop provides better system efficiency and higher switching speed. In a Schottky diode, a semiconductor-metal junction is formed between a semiconductor and a metal, thus creating a Schottky barrier. An N-type semiconductor acts as the cathode and the metal side acts as the anode of the Schottky diode. This Schottky barrier results in both a low forward voltage drop and very fast switching. ESD protection can be provided by cascading several large Schottky diodes. Due to the Schottky diode's low turn on voltage, several stacked diodes are required to handle the operating voltage, and a large area is required to handle the current. Thus using a Schottky diode configuration requires a large die area.

SUMMARY

Therefore a need exists for an efficient and compact ESD protection structure compatible with HEMT and other semiconductor devices that does not require using Schottky diodes.

According to an embodiment, an electrostatic discharge (ESD) protection device may comprise: a field effect transistor (FET) having a drain, at least two gates and a source, wherein the drain thereof may be coupled to a node of a circuit to be protected from an ESD event; at least one diode coupled between the source of the FET and a power supply common; a first resistor coupled between the at least two gates of the FET; and a second resistor coupled to a one of the at least two gates and the power supply common.

According to a further embodiment, one of the at least two gates may be a trigger gate and another one of the at least two gates may be a discharge gate. According to a further embodiment, the FET may be a depletion-mode FET. According to a further embodiment, the at least one diode may be two diodes connected in series between the source of the FET and power supply common. According to a further embodiment, the power supply common may be coupled to an electrical ground According to a further embodiment, the depletion-mode FET may be a high-electron-mobility transistor (HEMT). According to a further embodiment, the HEMT may be a pseudomorphic HEMT (pHEMT). According to a further embodiment, the HEMT may be a metamorphic HEMT (mHEMT). According to a further embodiment, the HEMT may be an induced HEMT.

According to a further embodiment, the FET, the at least one diode and the first and second resistors may be fabricated on an integrated circuit die and coupled to the circuit node that may be coupled to an external connection of the integrated circuit die. According to a further embodiment, a function of the external connection of the integrated circuit die may be selected from the group consisting of an analog input, a digital input, an analog output, a digital output, an analog input/output, a digital input/output, a power connection, a bias input, and an external compensation capacitor.

According to another embodiment, an electrostatic discharge (ESD) protection device may comprise: a first field effect transistor (FET) having a drain, at least two gates and a source, wherein the drain thereof may be coupled to a node of a circuit to be protected from an ESD event; at least one first diode having an anode coupled to the source of the first FET; a first resistor coupled between the at least two gates of the first FET; and a second resistor coupled to a one of the at least two gates and a cathode of the at least one first diode; a second field effect transistor (FET) having a drain, at least two gates and a source, wherein the drain thereof may be coupled to a power supply common; at least one second diode having an cathode coupled to the cathode of the at least one first diode; a third resistor coupled between the at least two gates of the second FET; and a fourth resistor coupled to a one of the at least two gates of second FET and a cathode of the at least one second diode.

According to a further embodiment, one of the at least two gates of the first and second FETs may be trigger gates and another one of the at least two gates of the first and second FETs may be discharge gates. According to a further embodiment, the first and second FETs may be depletion-mode FETs. According to a further embodiment, the at least one first and second diodes may be two diodes each connected in series between the sources of the first and second FETs. According to a further embodiment, the power supply common may be coupled to an electrical ground. According to a further embodiment, the first and second depletion-mode FETs may be high-electron-mobility transistors (HEMTs). According to a further embodiment, the HEMTs may be selected from the group consisting of pseudomorphic HEMTs (pHEMTs), metamorphic HEMTs (mHEMTs) and induced HEMTs.

According to a further embodiment, the first and second FETs, the at least one first and second diodes and the first, second, third and fourth resistors may be fabricated on an integrated circuit die and coupled to the circuit node that may be coupled to an external connection of the integrated circuit die. According to a further embodiment, a function of the external connection of the integrated circuit die may comprise a radio frequency signal input. According to a further embodiment, a function of the external connection of the integrated circuit die may comprise a radio frequency signal output.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, a pseudomorphic high electron mobility transistor (pHEMT), also known as heterostructure FET or modulation-doped FET is used as an example herein to describe the concept of a compact ESD protection device according to various embodiments disclosed herein. Heretofore, several large Schottky diodes had to be formed with the gate of a pHEMT device and cascaded in series to increase the voltage and adequately protect the active circuits. These multiple diode devices consumed a large area in an expensive GaAs integrated circuit die. According to various embodiments of this disclosure, it is proposed to use a multiple-gate HEMT to form a compact ESD protection device. The multiple-gates of the HEMT device may be used to form ESD trigger and charge draining paths for protection of circuits following the ESD protection devices and structures. The ESD protection device structure can be laid out in a much smaller area than the multiple diode ESD device structure. It is contemplated and within the scope of this disclosure that various types of HEMT devices, e.g., pHEMT, mHEMT, induced HEMT, etc., may be used with the ESD protection devices disclosed herein.

Referring now to the drawings, the details of example embodiments are schematically illustrated. Like elements in the drawings will be represented by like numbers, and similar elements will be represented by like numbers with a different lower case letter suffix.

Figure 1:
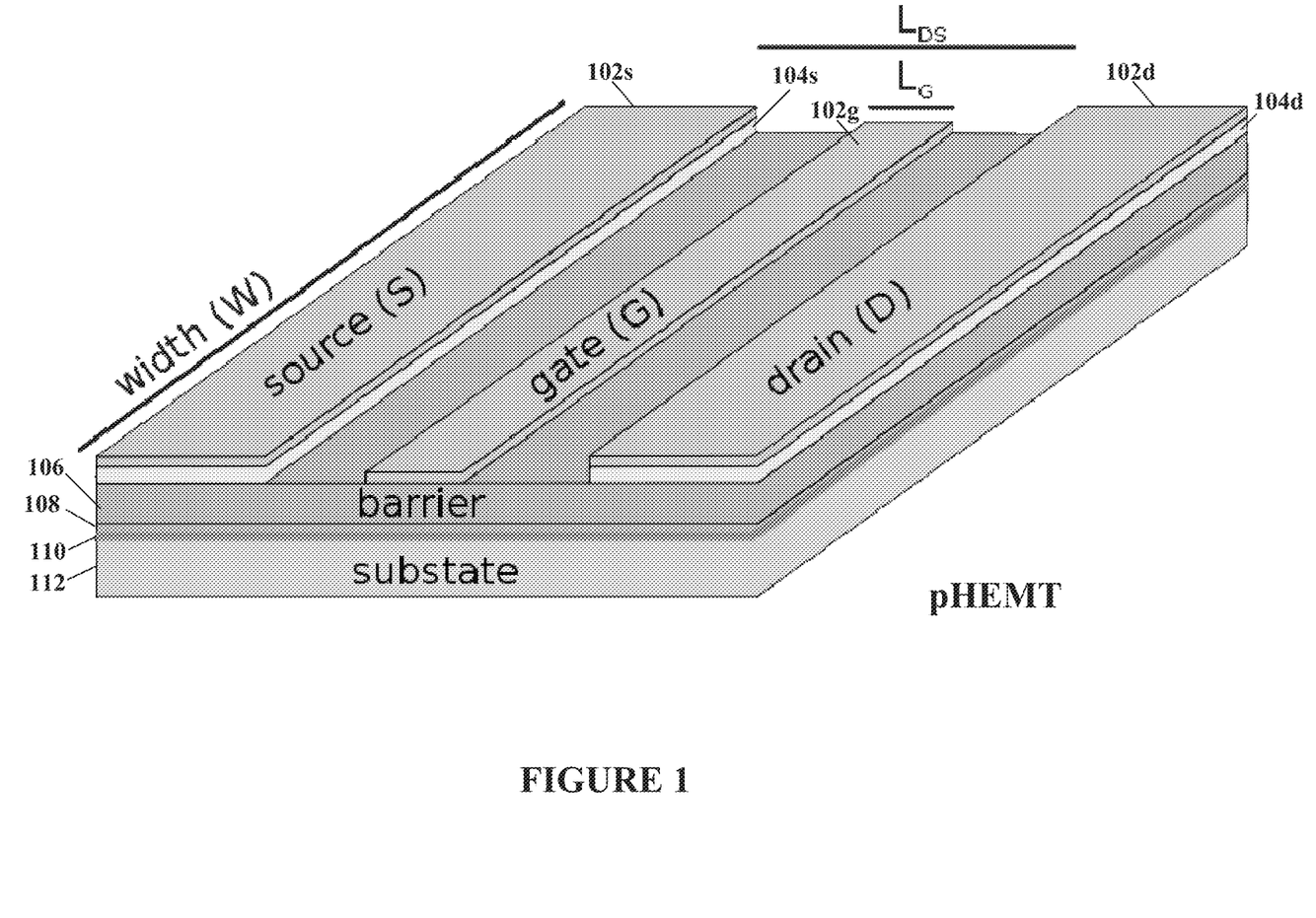
FIG. 1 illustrates a schematic isometric cross section diagram of a HEMT device, according to the teachings of this disclosure.

Referring to FIG. 1, depicted is a schematic isometric cross section diagram of a HEMT device, according to the teachings of this disclosure. A pHEMT is shown for illustrative purposes, but it is contemplated and within the scope of this invention that other HEMT devices may be similarly used according to the teachings of this disclosure. The HEMT device may comprise a substrate 112, a two dimensional electron gas layer 110, a spacer 108, a barrier 106, a capping layer 104, and metal drain, source and gate electrodes 102. The source, gate and drain metal 102 may comprise, but is not limited to, gold. The barrier 106 may comprise, but is not limited to, aluminum gallium arsenide (AlGaAs). The spacer 108 may comprise, but is not limited to, gallium arsenide (GaAs). The two dimensional electron gas layer 110 may comprise, but is not limited to, indium gallium arsenide (InGaAs). The substrate may comprise, but is not limited to, high resistivity GaAs. The first resistor 210 may have a resistance value of from about 500 ohms to about 2000 ohms. The second resistor 212 may have a resistance value of about 2000 ohms.

Figure 2:
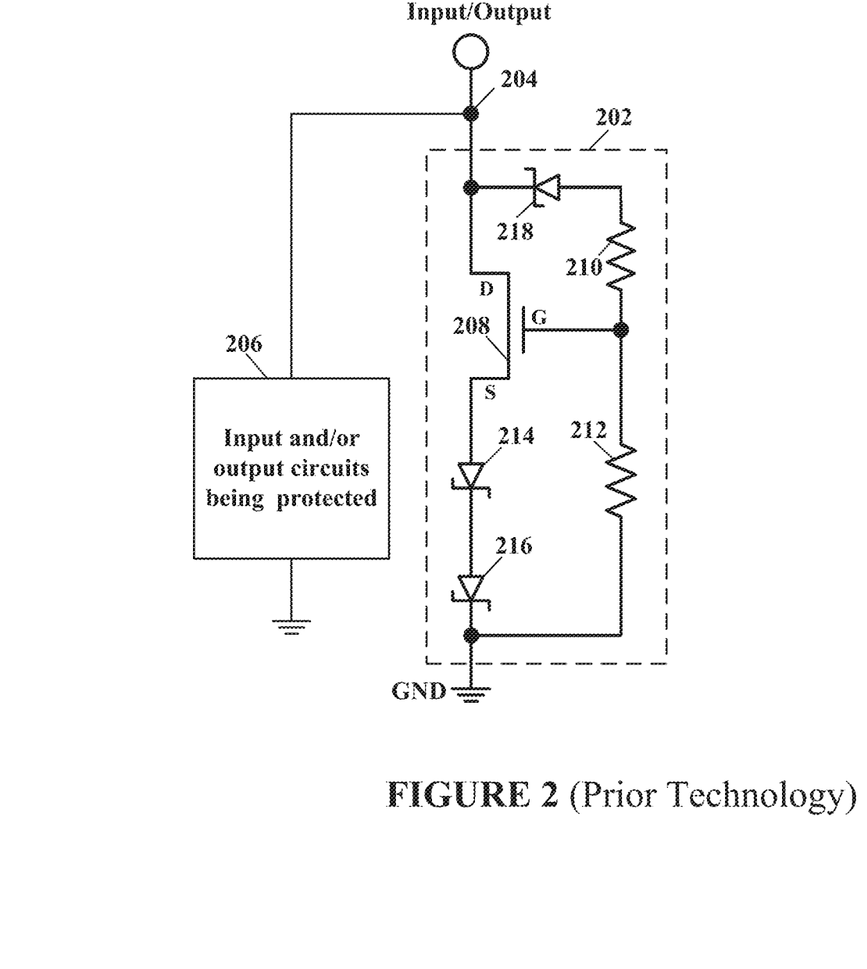
FIG. 2 illustrates a schematic diagram of a prior technology single polarity depletion-mode FET ESD protection device for direct current (DC) and control ports.
Figure 4:
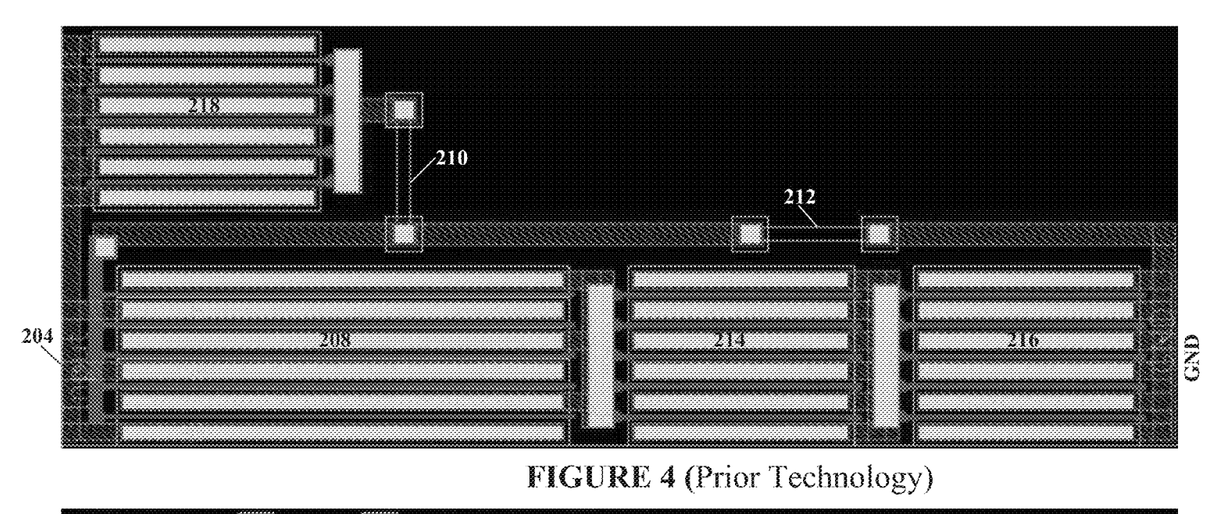
FIG. 4 illustrates a schematic plan view of a prior technology structure for the ESD protection device shown in FIG. 2.

Referring to FIGS. 2 and 4, depicted are a schematic diagram of a prior technology single polarity depletion-mode FET ESD protection device for direct current (DC) and control ports, and a schematic plan view of the prior technology structure for the ESD protection device shown in FIG. 2. A single polarity single-gate ESD protection device 202 has been used to protect control signal and/or bias supply nodes (pins) of circuits 206 of an integrated circuit package (not shown). The ESD protection device 202 may comprise a field effect transistor (FET) 208 having a drain (D), a source (S) and a single gate (G); first and second Schottky diodes 214 and 216, a third diode 218, and first and second gate resistors 210 and 212. The third diode 218 is a trigger diode that conducts (goes into avalanche breakdown) when an ESD event occurs, thereby turning on the transistor 208. The Schottky diodes 214 and 216 are used for voltage level shifting to prevent the depletion mode transistor 208 from turning on and conducting current during normal operation.

Figure 3:
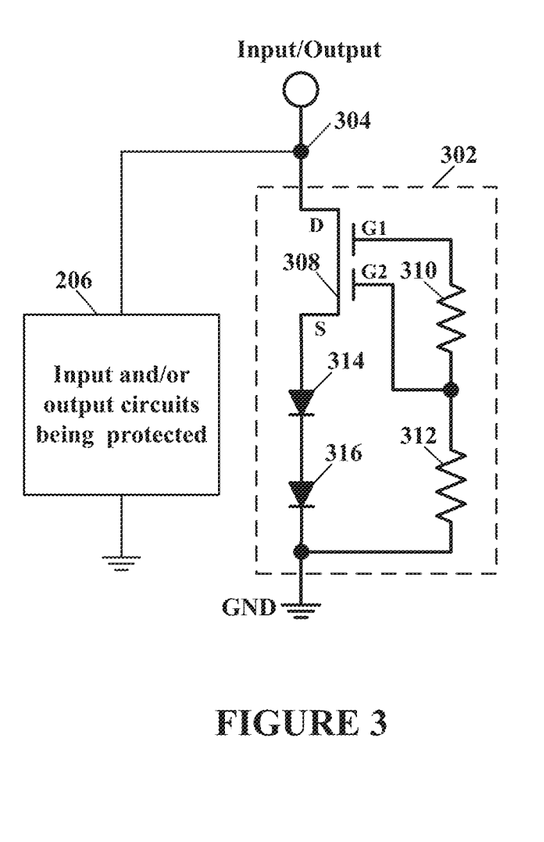
FIG. 3 illustrates a schematic diagram of a single polarity multi-gate Schottky depletion-mode FET ESD protection device for direct current (DC) and control ports, according to a specific example embodiment of this disclosure.
Figure 5:
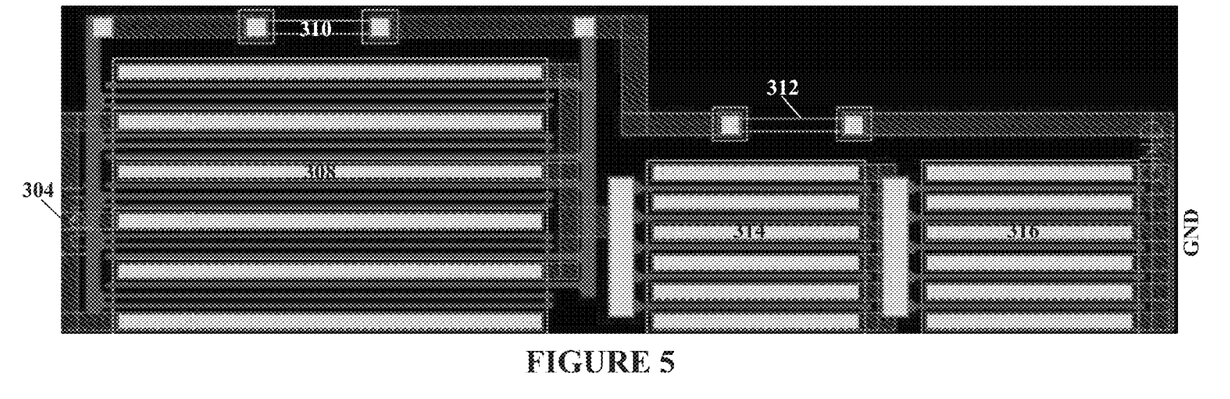
FIG. 5 illustrates a schematic plan view of a structure for the ESD protection device shown in FIG. 3, according to a specific example embodiment of this disclosure.
Figure 6:
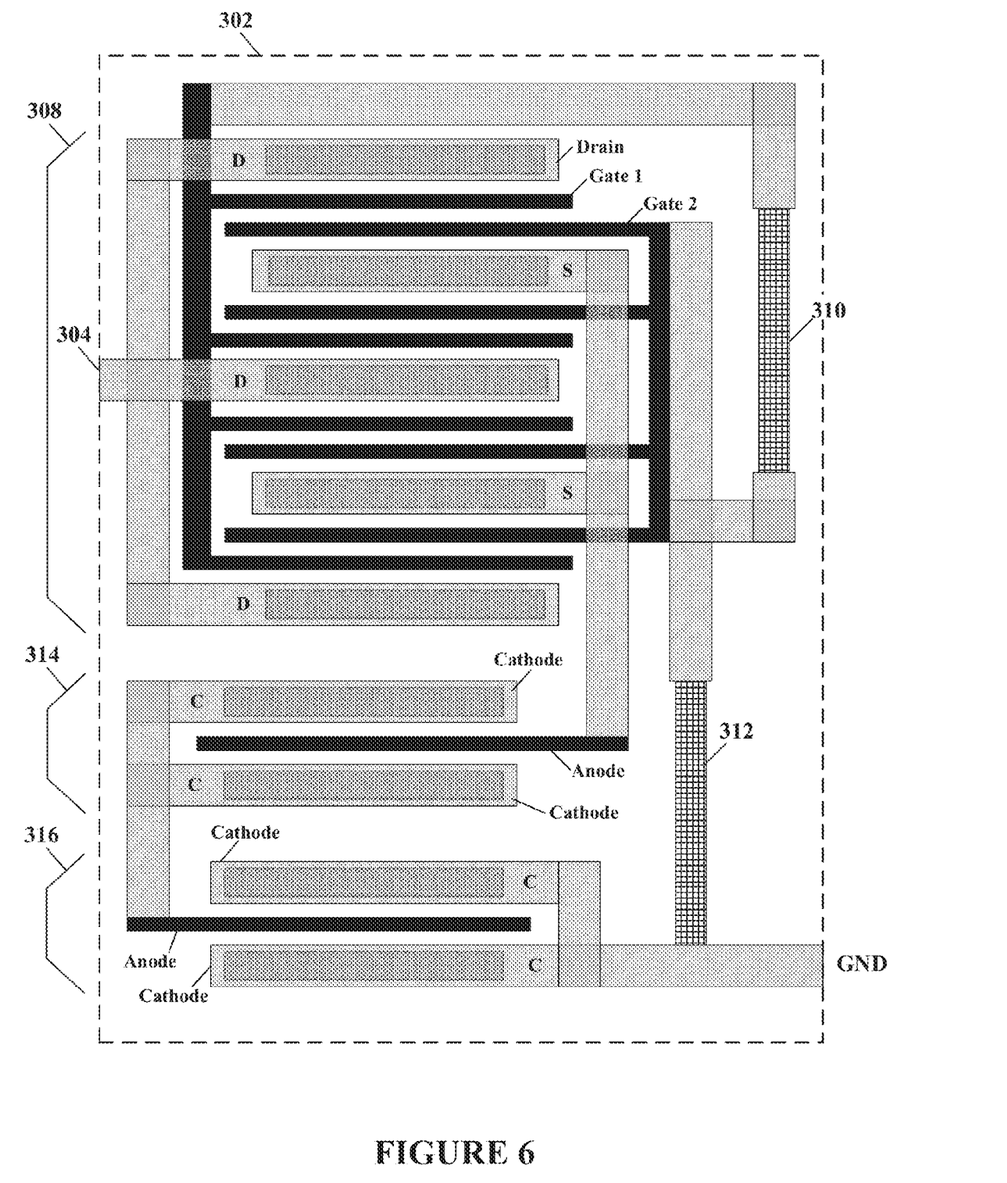
FIG. 6 illustrates a more detailed schematic plan view of a structure for the ESD protection device shown in FIG. 3, according to a specific example embodiment of this disclosure.

Referring to FIGS. 3, 5 and 6, depicted are a schematic diagram of a single polarity multi-gate Schottky depletion-mode FET ESD protection device for direct current (DC) and control ports, and schematic plan views of a structure for the ESD protection device shown in FIG. 3, according to a specific example embodiment of this disclosure. A single polarity ESD protection device 302 having Schottky multi-gates may be used to protect control signal and/or bias supply nodes (pins) of circuits 306 of an integrated circuit package (not shown). The ESD protection device 302 may comprise a multi-gate Schottky depletion-mode field effect transistor (FET) 308, e.g., HEMT device, having a drain (D), a source (S), first and second trigger gates (G1 and G2), first and second diodes 314 and 316, and first and second gate resistors 310 and 312. It is contemplated and within the scope of this disclosure that the FET 308 may have two or more gates. At least one level shifting diode may be coupled between the source of the FET 308 and a power supply common, e.g., an electrical ground. The drain of the FET 308 may be coupled to a node 304 that may be coupled to an external connection (pin) of an integrated circuit (IC) package (not shown). The external connection (pin) of the IC package may be used as, for example but not limited to, an analog input, a digital input, an analog output, a digital output, an analog input/output, a digital input/output, a power connection, a bias input, an external compensation capacitor, etc.

When negative electrostatic charges accumulate at node 304 the second trigger gate (G2) will be forward biased and drain these charges to ground through the second gate resistor 312. When positive electrostatic charges accumulate at the node 304, a positive potential will be built up until the first trigger gate (G1) is in reverse breakdown. This breakdown current will flow to ground and establish a positive potential across the second gate resistor 312. Thus providing sufficient voltage to turn on FET 308 with the second gate G2 thereof when the gate-to-source potential is more positive than the turn-on voltage of the series connected first and second diodes 314 and 316. These first and second diodes 314 and 316 are coupled between the source of the FET 308 and a power supply common, e.g., ground, and provide voltage level shifting to prevent a depletion mode transistor from turning on (conducting). The drain current of the FET 308 provides another path to dissipate the positive electrostatic charges at the node 304 and helps to prevent the first trigger gate G1 from having excessive breakdown current that may damage the first trigger gate G1.

Hence, a multi-gate structure FET 308 is a unique way to combine a trigger diode device and a discharge gate FET that saves precious integrated circuit die area. In addition, only three active device areas are necessary for the single polarity multiple-gate ESD protection device 302: 1) FET 308, 2) and 3) first and second diodes 314 and 316. The prior technology ESD protection device 202 requires four active device areas 1) FET 208, 2) trigger third diode 218, 3) and 4) level shifting diodes 214 and 216. Therefore, the prior technology ESD protection device 202 requires a larger active device area on the integrated circuit die (not shown) than does the single polarity multiple-gate ESD protection device 302 to achieve the same ESD protection level, according to the teachings of this disclosure.

Figure 7:
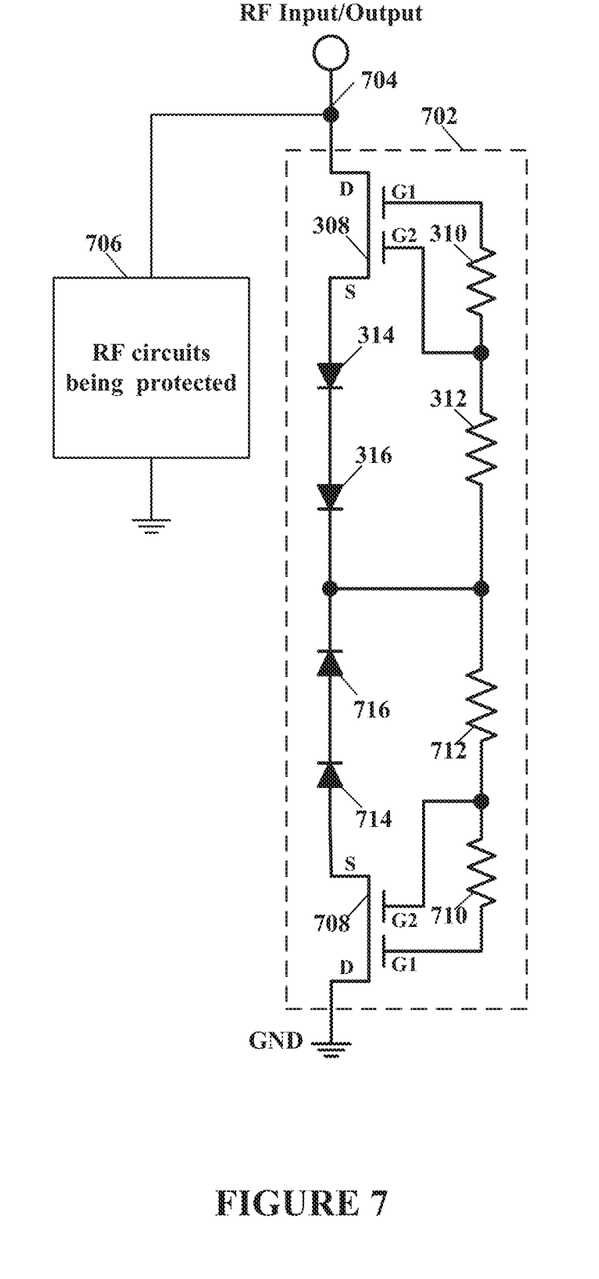
FIG. 7 illustrates a schematic diagram of a dual polarity multi-gate Schottky depletion-mode FET ESD protection device for radio frequency (RF) ports, according to another specific example embodiment of this disclosure.
Figure 8:
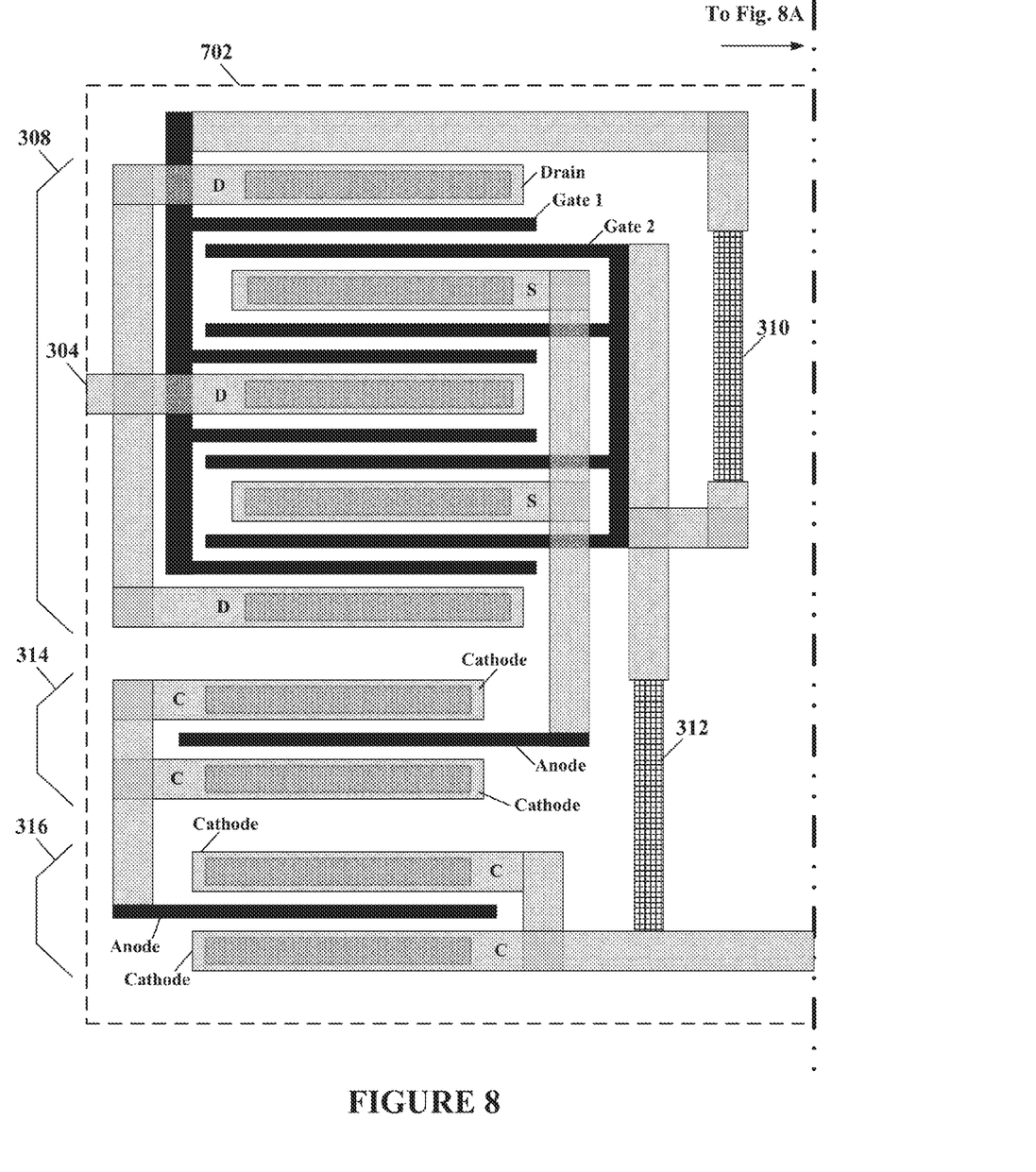
FIGS. 8 and 8A illustrate a schematic plan view of a structure for the ESD protection device shown in FIG. 7, according to a specific example embodiment of this disclosure.
Figure 8A:
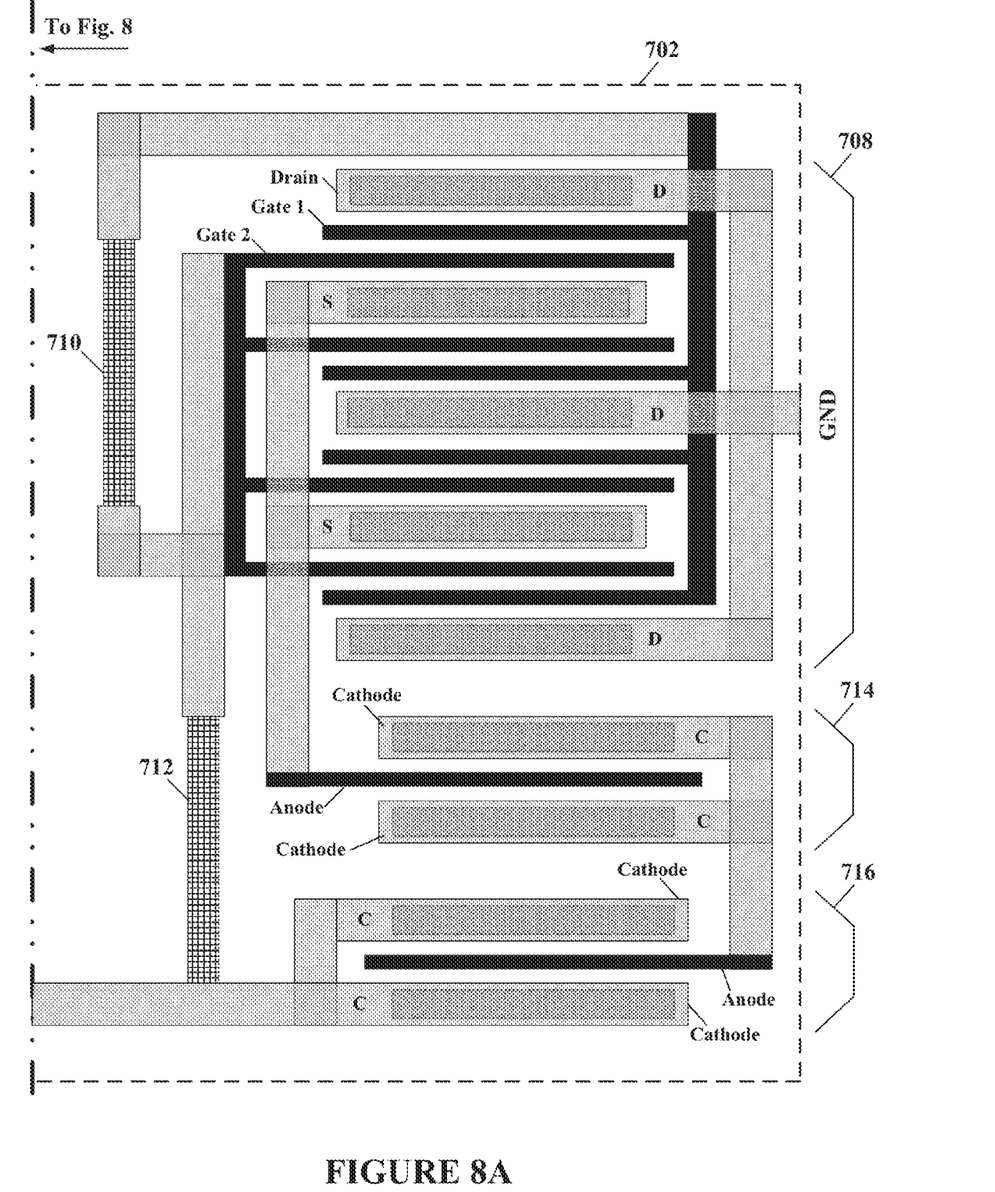

Referring to FIGS. 7, 8 and 8A, depicted are a schematic diagram of a dual polarity multi-gate Schottky depletion-mode FET ESD protection device for radio frequency (RF) ports, and a schematic plan view of a structure for the ESD protection device shown in FIG. 7, according to another specific example embodiment of this disclosure. A dual polarity multi-gate Schottky depletion-mode FET ESD protection device 702 may be used to protect control, signal and/or bias supply nodes (pins) of circuits 706 of an integrated circuit package (not shown). The ESD protection device 702 may comprise a first HEMT device 308 having a drain, a source and first and second gates (G1 and G2); first and second diodes 314 and 316, first and second gate resistors 310 and 312, a second HEMT device 708 having a drain, a source and first and second gates (G1 and G2); third and fourth diodes 714 and 716, third and fourth gate resistors 710 and 712. The ESD protection device 702 may advantageously be used with RF ports that are associated with high RF power devices. This ESD protection circuit may be used in the presence of large positive and negative RF voltage swings. The working principle of this dual polarity multi-gate FET ESD protection device 702 is substantially similar to that of the single polarity multi-gate ESD protection device 308. Elements 708-716 function as a mirror image of the elements 308-316.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An electrostatic discharge (ESD) protection device, comprising:
 a field effect transistor (FET) having a drain, at least two gates and a source, wherein the drain thereof is coupled to a node of a circuit to be protected from an ESD event;
 at least one diode coupled between the source of the FET and a power supply common;
 a first resistor coupled between the at least two gates of the FET; and
 a second resistor coupled to a one of the at least two gates and the power supply common.

2. The ESD protection device according to claim 1, wherein one of the at least two gates is a trigger gate and another one of the at least two gates is a discharge gate.

3. The ESD protection device according to claim 1, wherein the at least one diode are two diodes connected in series between the source of the FET and power supply common.

4. The ESD protection device according to claim 1, wherein the power supply common is coupled to an electrical ground.

5. The ESD protection device according to claim 1, wherein the FET, the at least one diode and the first and second resistors are fabricated on an integrated circuit die and coupled to the circuit node that is coupled to an external connection of the integrated circuit die.

6. The ESD protection device according to claim 5, wherein a function of the external connection of the integrated circuit die is selected from the group consisting of an analog input, a digital input, an analog output, a digital output, an analog input/output, a digital input/output, a power connection, a bias input, and an external compensation capacitor.

7. The ESD protection device according to claim 1, wherein the FET is a depletion-mode FET.

8. The ESD protection device according to claim 7, wherein the depletion-mode FET is a high-electron-mobility transistor (HEMT).

9. The ESD protection device according to claim 8, wherein the HEMT is a pseudomorphic HEMT (pHEMT).

10. The ESD protection device according to claim 8, wherein the HEMT is a metamorphic HEMT (mHEMT).

11. The ESD protection device according to claim 8, wherein the HEMT is an induced HEMT.

12. An electrostatic discharge (ESD) protection device, comprising:

a field effect transistor (FET) having a drain, at least two gates and a source, wherein the drain thereof is coupled to a node of a circuit to be protected from an ESD event;

at least one diode having an anode coupled with the source of the FET;

a first resistor coupled between the at least two gates of the FET; and a second resistor coupled to a one of the at least two gates and a cathode of the at least one diode.

13. The ESD protection device according to claim 12, wherein one of the at least two gates is a trigger gate and another one of the at least two gates is a discharge gate.

14. The ESD protection device according to claim 12, wherein the at least one diode are two diodes connected in series.

15. The ESD protection device according to claim 12, wherein the cathode of the at least one diode is coupled with an electrical ground.

16. The ESD protection device according to claim 12, wherein the FET is a depletion-mode FET.

17. The ESD protection device according to claim 16, wherein the depletion-mode FET is a high-electron-mobility transistor (HEMT).

18. The ESD protection device according to claim 17, wherein the HEMT is a pseudomorphic HEMT (pHEMT) or a metamorphic HEMT (mHEMT).

19. The ESD protection device according to claim 17, wherein the HEMT is an induced HEMT.

20. The ESD protection device according to claim 17, wherein the FET, the at least one diode and the first and second resistors are fabricated on an integrated circuit die and coupled to the circuit node that is coupled to an external connection of the integrated circuit die.

21. The ESD protection device according to claim 20, wherein a function of the external connection of the integrated circuit die is selected from the group consisting of an analog input, a digital input, an analog output, a digital output, an analog input/output, a digital input/output, a power connection, a bias input, and an external compensation capacitor.

* * * * *